United States Patent
Takemura

(10) Patent No.: US 6,765,817 B2
(45) Date of Patent: Jul. 20, 2004

(54) SEMICONDUCTOR MEMORY

(75) Inventor: Takashi Takemura, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 42 days.

(21) Appl. No.: 10/309,160

(22) Filed: Dec. 4, 2002

(65) Prior Publication Data

US 2003/0189221 A1 Oct. 9, 2003

(30) Foreign Application Priority Data

Apr. 8, 2002 (JP) ........................................ 2002-105662

(51) Int. Cl.[7] .............................................. G11C 11/40
(52) U.S. Cl. ...................................... 365/154; 365/190
(58) Field of Search ................................ 365/154, 156, 365/190, 227

(56) References Cited

U.S. PATENT DOCUMENTS 5,521,861 A * 5/1996 Lee et al. .................... 365/156
6,091,626 A * 7/2000 Madan ........................ 365/154

OTHER PUBLICATIONS

Noutaro Shibata Hiroki Morimura A 1–V Battery Operated 0.25–$\mu$m SRAM Macrocell for Portable Equipment 1997,pp. 1–8.

* cited by examiner

*Primary Examiner*—Tan T. Nguyen
(74) *Attorney, Agent, or Firm*—Volentine Francos, PLLC

(57) ABSTRACT

A semiconductor memory which operates at low power supply voltage with lower power consumption without decreasing writes rate is provided. During data read, a virtual ground line VGj provided to correspond to a bit line pair BLj, /BLj of a read target memory cell $11_{ij}$ is connected to a ground voltage GND through a transistor $31_j$. As a result, the bit line BLj (or /BLj) corresponding to "L" level is connected to the ground voltage GND through an acceleration circuit AC provided in the memory cell $11_{ij}$ to thereby accelerate read rate. During data write, the virtual ground line VGj corresponding to the write target bit line pair BLj, /BLj is connected to a power supply voltage VDD through a transistor $33_j$. As a result, a current is prevented from flowing from the bit line BLj (or /BLj) at "H" level to the virtual ground line VGj and the write rate is not decreased.

15 Claims, 6 Drawing Sheets

SEMICONDUCTOR MEMORY

BACKGROUND OF THE INVENTION

The present invention relates to a semiconductor memory suited for, for example, a mobile terminal which operates by a battery. More specifically, the present invention relates to a semiconductor memory, such as an SRAM (Static Random Access Memory), which realizes high-rate operation at low power supply voltage.

DESCRIPTION OF THE RELATED ART

As a technique related to this field, there has been known hitherto one described in the following document:

Shibata and Morimura, "0.25-$\mu$m SRAM Micro-Cell operating at 1V for Mobile Terminal", pp. 1–8, Shingakugiho, ICD97-52 (1997-6), Journal of IEICE (Institute of Electronics, Information and Communication Engineers).

An SRAM is widely used as a cache memory for an ASIC (Application Specific IC) or the like which is used in a mobile terminal or the like. Since the mobile terminal or the like employs a battery as a power supply, low power supply voltage and low power consumption are required for the mobile terminal or the like. If power supply voltage is decreased, the operating rates of MOS transistors which constitute the SRAM decrease. In turn, when the threshold voltages of the MOS transistors are decreased to accelerate the respective operating rates, in a standby state, leak current caused by sub-threshold current increases, thereby disadvantageously increasing power consumption.

To solve these disadvantages, there is proposed an MTCMOS (Multi-Threshold CMOS) based on a CMOS (complementary MOS transistor) LSI technique, which can operate at low power supply voltage (e.g., 1V) when being active and which can prevent an increase in power consumption due to leak current in a standby state.

FIGS. 6A and 6B show a conventional SRAM which utilizes the MTCMOS technique described in the above-cited document. FIG. 6A is a schematic block diagram showing the entire SRAM, and FIG. 6B is a circuit diagram showing the configuration of a memory cell and that of a peripheral circuit thereof.

As shown in FIG. 6A, this SRAM includes a memory cell array 10 consisting of high threshold voltage MOS transistors, and a peripheral circuit 20 consisting of low threshold voltage MOS transistors.

The memory cell array 10 is comprised of a plurality of word lines WLi and a plurality of bit line pairs BLj, /BLj (where "/" means inversion or low active) arranged to be orthogonal to the respective word lines WLi. Memory cells $11_{ij}$ for data storage are connected to the intersections between the word lines and the bit line pairs, respectively.

The peripheral circuit 20 includes an address decoder 21 and an input/output circuit 22.

The address decoder 21 is a circuit which decodes a row address in an address signal AD applied from the outside of the SRAM, and selects a corresponding word line WLi in the memory cell array 10. The input/output circuit 22 is a circuit which decodes a column address in the address signal AD to output a column select signal/Yj, and which reads and writes data DA from and to the memory cells $11_{ij}$ connected to the bit line pair BLj, /BLj selected by this column select signal/Yj in accordance with a read control signal/RE and a write control signal/WE, respectively.

The peripheral circuit 20 is connected to the power supply voltage VDD of a battery through a switch 23 consisting of a high threshold voltage MOS transistor. In a standby state, the switch 23 is controlled to be turned off using a sleep signal SL to thereby suppress the consumption of the battery caused by sub-threshold leak current. On the other hand, the memory cell array 10 is constantly turned on since the memory cell array 10 cannot be disconnected from the power supply during a standby state so as to hold the storage contents of the memory cells. Due to this, the MTCMOS technique is applied to the memory cell array 10 in order to suppress the sub-threshold leak current and to accelerate operation rate.

As shown in FIG. 6B, each memory cell $11_{ij}$ in this memory cell array 10 includes a flip-flop FF consisting of high threshold voltage inverters L1 and L2 which hold data on nodes N1 and N2. A high threshold voltage N channel MOS transistor Q1 driven by the potential of the word line WLi connects the bit line BLj with positive phase to the node N1. A high threshold voltage N channel MOS transistor Q2 driven by the potential of the same word line WLi connects the bit line /BLj with opposite phase to the node N2.

Further, the memory cell $11_{ij}$ includes an acceleration circuit AC which encourages discharging the bit line pair BLj, /BLj and thereby accelerates read operation. The acceleration circuit AC consists of low threshold voltage N channel MOS transistors Q3 to Q6. The transistors Q3 and Q4 are connected to the bit lines BLj and /BLj, respectively and driven by the potential of the word line WLi. The transistors Q3 and Q5 are connected in series and the transistors Q4 and Q6 are connected in series. One end of the transistors Q5 and Q6 are connected to each virtual ground line VGj arranged in parallel to the bit lines BLj. The transistors Q5 and Q6 are driven by the potentials of the nodes N1 and N2, respectively.

One end of the virtual ground line VGj is connected to a ground voltage GND through a high threshold voltage N channel MOS transistor $31_j$. The transistor $31^j$ is controlled to be turned on and off by the output signal of a NOR circuit $32_j$ which NORs the read control signal/RE and the column select signal/Yj.

The operation of the memory cell $11_{ij}$ shown in FIG. 6B will next be described.

During data write, when the word line WLi is selected to be set at "H" level, the transistors Q1 to Q4 are turned on and the data of the bit line data pair BLj, /BLj is held in the flip-flop FF. At this moment, the read control signal/RE is inactive and set at "H" level. Therefore, the output signal of the NOR circuit $32_j$ is at "L" level and the transistor $31_j$ is turned off. Accordingly, the virtual ground line VGj turns into a floating state and the transistors Q3 and Q4 in the acceleration circuit AC do not influence data write operation.

During data read, when the read control signal/RE is activated to be set at "L" level and the column select signal/Yj is selected to be set at "L" level, the level of the output signal of the NOR circuit $32_j$ becomes "H" level. As a result, the transistor $31_j$ is turned on and the virtual ground line VGj is connected to the ground voltage GND. If the word line WLi is then selected to be set at "H" level, the transistors Q1 to Q4 are turned on. At this moment, one of the nodes N1 and N2 is at "H" level, so that one of the transistors Q5 and Q6 is turned on.

For example, when the node N1 is at "H" level and the node N2 is at "L" level, the transistor Q5 is turned off and the transistor Q6 is turned on. As a result, not only the inverters L1 and L2 drive the bit line pair BLj, /BLj but also the low threshold voltage transistors Q3 to Q6 having high current driving abilities drive the bit line pair BLj, /BLj. Thus, read operation can be accelerated. That is, when the "H" level of the node N1 and the "L" level of the node N2 are to be read, the transistor Q6 is turned on. Due to this, the potential of the bit line /BLj is decreased to the ground voltage GND through the transistors Q4, Q6 and $31j$, accelerating the read operation.

Further, in a standby state, the high threshold voltage transistor $31_j$ is turned off by the output signal of the NOR circuit $32_j$ and the leak current caused by the sub-threshold currents of the low threshold voltage transistors Q3 to Q6 is shut off, so that low power consumption can be realized.

The conventional memory cell, however, has the following disadvantages.

During data read, the transistor $31_j$ is turned on, the virtual ground line VGj is connected to the ground voltage GND, charge from the acceleration circuit AC is discharged to the ground voltage GND through this transistor $31_j$ and the read operation is thereby accelerated.

In write operation performed after this read operation, the transistor $31_j$ is turned off and the virtual ground line VGj turns into a floating state. At this moment, the potential of the virtual ground line VGj is close to the ground voltage GND. It is assumed herein, for example, that while the node N1 is at "H" level and the node N2 is at "L" level, inverted data is written to the nodes N1 and N2 (i.e., "L" level is written to the node N1 and "H" level is written to the node N2). In this case, when the level of the word line WLi rises to "H" level, the low threshold voltage transistors Q3 and Q4 are first turned on as compared with the high threshold voltage transistors Q1 and Q2 and then the transistors Q1 and Q2 are turned on late.

When the transistors Q3 and Q4 are turned on, the transistor Q1 is still turned off to thereby set the node N1 at "H" level and the transistor Q6 is, therefore, turned on. Due to this, the potential of the bit line /BLj is decreased to be equal to that of the virtual ground line VGj in a floating state which potential is close to the ground voltage GND, through the transistors Q4 and Q6. As a result, when the transistors Q1 and Q2 are turned on later and the "H" level of the bit line /BLj is to be written to the node N2, it is disadvantageously difficult to write the data to the bit line /BLj and the operation rate for writing the inverted data is disadvantageously decreased.

SUMMARY OF THE INVENTION

The present invention has been made to solve the disadvantages of the conventional art. It is, therefore, an object of the present invention to provide a semiconductor memory which can prevent write operation rate from being decreasing and which can operate at low power supply voltage with low power consumption.

To attain this object, a first invention of the present invention provides a semiconductor memory comprising: a bit line pair consisting of a first bit line and a second bit line complementary to each other; a pseudo power supply line provided to correspond to the bit line pair; a word line arranged to cross the bit line pair; a data holding circuit provided at an intersection between the bit line pair and the word line, and having a first node and a second node holding data complementary to each other; a high threshold voltage first transistor connected between the first bit line and the first node, and driven by a potential of the word line; a high threshold voltage second transistor connected between the second bit line and the second node, and driven by the potential of the word line; a low threshold voltage third transistor connected between the first bit line and a third node, and driven by the potential of the word line; a low threshold voltage fourth transistor connected between the second bit line and a fourth node, and driven by the potential of the word line; a low threshold voltage fifth transistor connected between the third node and the pseudo power supply line, and driven by the data on the second node; a low threshold voltage sixth transistor connected between the fourth node and the pseudo power supply line, and driven by the data on the first node; a first switch circuit connected between the pseudo power supply line and a ground voltage, and turned on when the data is read from the data holding circuit and turned off otherwise; and a second switch circuit connected between the pseudo power supply line and a power supply voltage, and turned on when the data is written to the data holding circuit and turned off otherwise.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

First Embodiment

Figure 1:
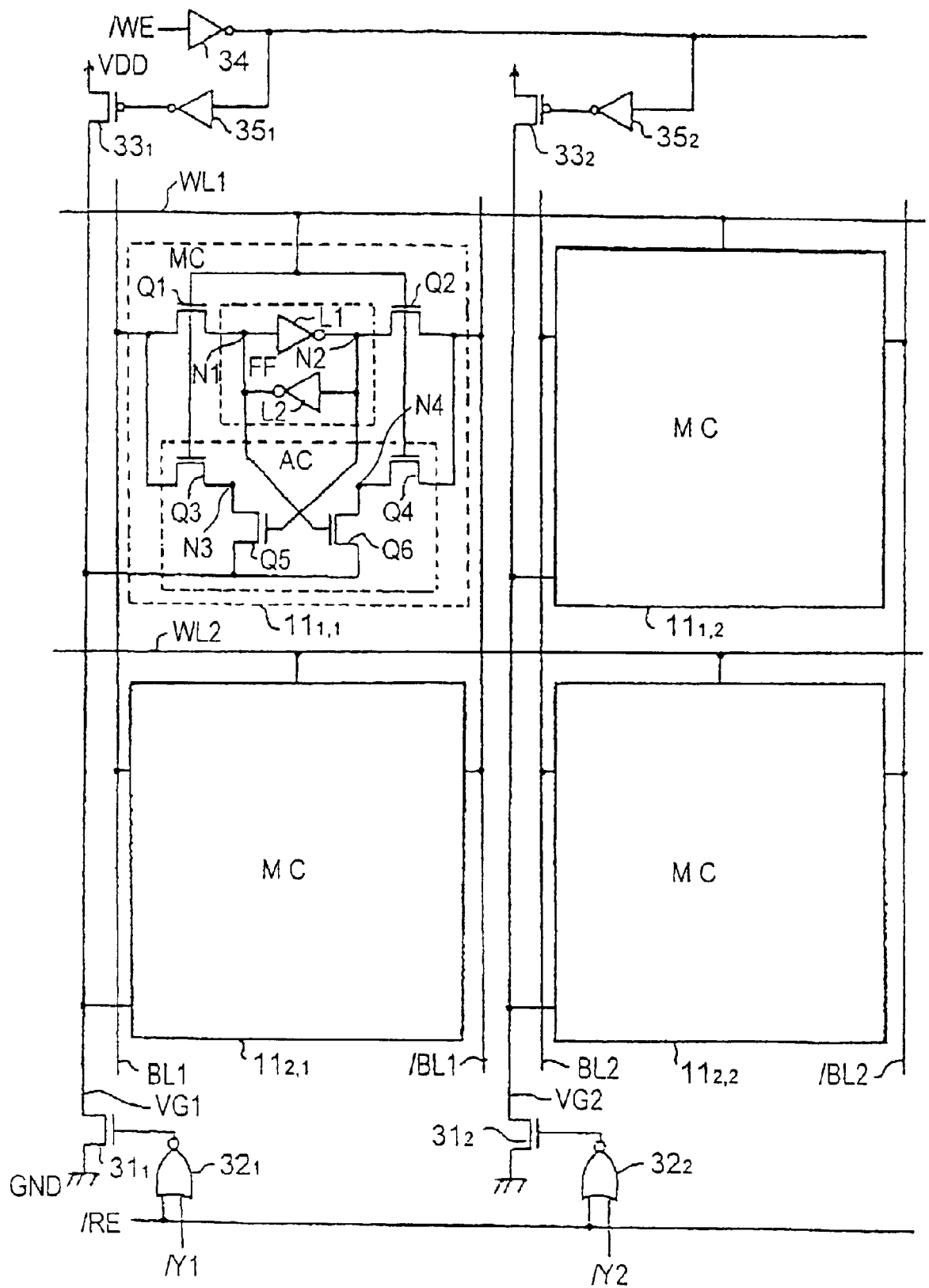
FIG. 1 is a block diagram showing the important parts of an SRAM in the first embodiment according to the present invention.
Figure 6A:
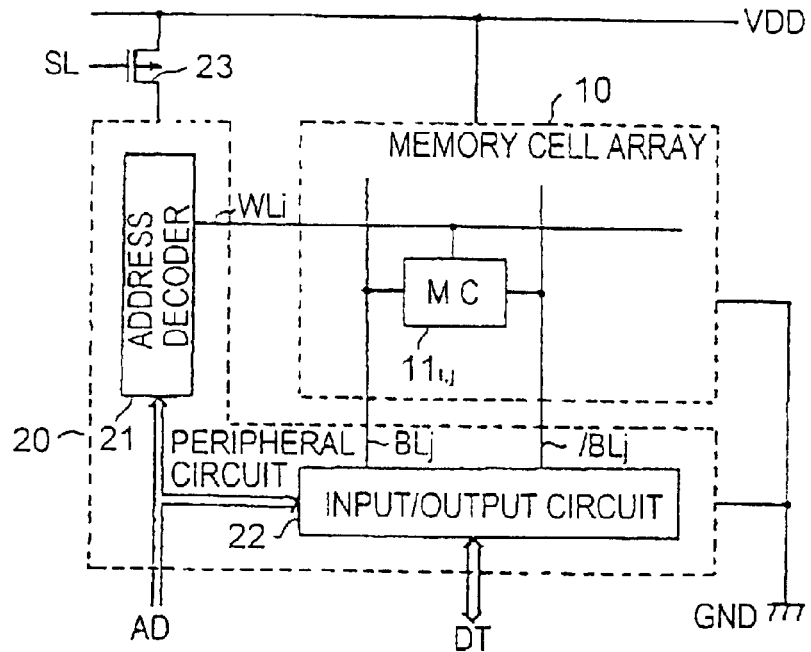
FIG. 6 is a block diagram of a conventional SRAM.
Figure 6B:
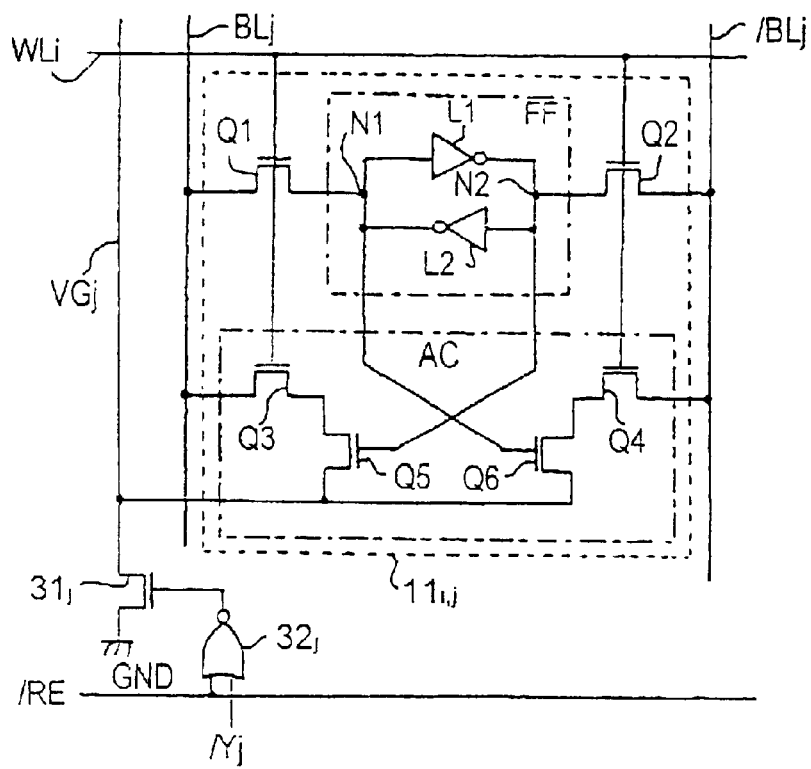

FIG. 1 is a block diagram showing the important parts of an SRAM in the first embodiment according to the present invention. In FIG. 1, the same constituent elements as those shown in FIG. 6 are denoted by the same reference symbols, respectively.

This SRAM, which is used as, for example, a cache memory of an ASIC or the like used in a mobile terminal or the like, includes a plurality of word lines WLi (where i=1, 2, . . . ) arranged in parallel. A plurality of bit line pairs BLj, /BLj (where j=1, 2, . . . ) each consisting of a bit line BLj with positive phase and a bit line /BLj with opposite phase, are arranged in parallel in a direction orthogonal to the word lines WLi. Further, pseudo power supply lines (e.g., virtual ground lines) VGj are arranged in parallel to the bit lines BLj.

Memory cells $11_{i,\,j}$ for data storage are arranged at intersections between the word lines WLi and bit line pairs BLj, /BLj, respectively. Since the memory cells $11_{i,\,j}$ are the same in configuration, a memory cell $11_{1,\,1}$ will be described herein.

The memory cell $11_{1,\,1}$ includes a flip-flop FF consisting of high threshold voltage inverters L1 and L2 which hold data on nodes N1 and N2. A high threshold voltage (e.g., Vt=0.3V) N channel MOS transistor Q1 driven by a potential of the word line WL1 connects a bit line BLi with positive phase to the node N1. A high threshold voltage N channel MOS transistor Q2 driven by the potential of the same word line WL1 connects a bit line /BL1 with opposite phase to the node N2.

Further, this memory cell $11_{1,1}$ includes an acceleration circuit (auxiliary read circuit) AC which encourages discharging the bit lines BL1, /BL1 and thereby accelerates read operation. The acceleration circuit AC consists of low threshold voltage (e.g., Vt=0.15V) N channel MOS transistors Q3 to Q6. The transistor Q3 is connected between the bit line BL1 and the node N3, and driven by the potential of the word line WL1. The transistor Q4 is connected between the bit line/BL1 and the node N4, and driven by the potential of the word line WL1. The transistors Q3 and Q5 are connected in series and the transistors Q4 and Q6 are connected in series. One ends of the transistors Q5 and Q6 are connected to the virtual ground line VG1 arranged in parallel to the bit line BL1. The transistors Q5 and Q6 are driven by the potentials of the nodes N1 and N2, respectively.

Each of the transistors Q1 to Q6 consists of a field effect transistor. It is thereby possible to decrease power consumption.

One end of the virtual ground line VG1 is connected to a ground voltage GND through a high threshold voltage N channel MOS transistor $31_1$. The transistor $31_1$ is controlled to be turned on and off by the output signal of a NOR circuit $32_1$ which NORs a read control signal/RE and a column select signal/Yj.

The other end of the virtual ground line VG1 is connected to a power supply voltage VDD (e.g., 1.2V) through a high threshold voltage P channel MOS transistor $33_1$. The transistor $33_1$ is controlled to be turned on and off by a write control signal/WE through inverters 34 and $35_1$ connected in series.

Figure 2:
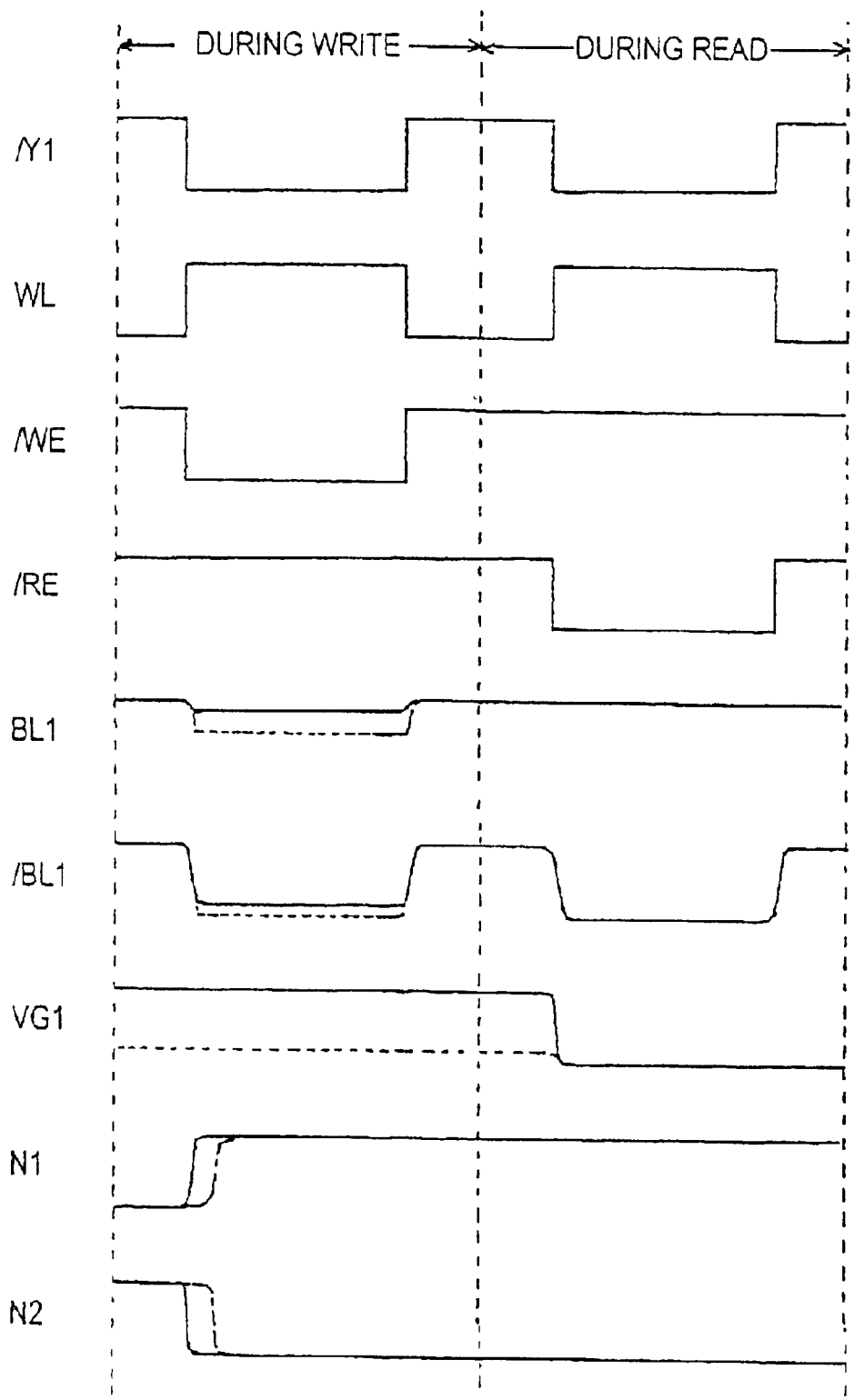
FIG. 2 is a signal waveform view showing the operation of the SRAM shown in FIG. 1.

FIG. 2 is a signal waveform view showing the operation of the SRAM shown in FIG. 1. In FIG. 2, the signal waveforms of the SRAM shown in FIG. 1 are denoted by solid lines and those of the conventional SRAM shown in FIG. 6 are denoted by broken lines for comparison purposes. The operation of the SRAM shown in FIG. 1 will now be described with reference to FIG. 2.

When this SRAM is not accessed, the read control signal/RE and the write control signal/WE are both at "H" level and the transistors $31_1$ and $33_1$ are turned off. The virtual ground line VG1 is, therefore, in a floating state. Further, the word line WL1 is at "L" level and the bit line pair BL1, /BL1 are precharged to "H" level by a precharge circuit which is not shown in FIG. 1.

The data write operation of the SRAM will first be described.

In this data write operation, it is assumed herein that while "L" level and "H" level are held in the nodes N1 and N2 of the flip-flop FF of the memory cell $11_{1,1}$, respectively, pieces of data for inverting these levels are written to the nodes N1 and N2, respectively (i.e., "H" level and "L" level are written to the nodes N1 and N2, respectively). In this case, since the read control signal/RE is at "H" level, the transistor $31_1$ is turned off. Further, since the nodes N1 and N2 are at "L" level and "H" level, respectively, the transistors Q5 and Q6 are turned on and off, respectively.

Here, write data is transmitted to the bit line pair BL1, /BL1 and the write control signal/WE is set at "L" level. As a result, the transistor $33_1$ is turned on and the virtual ground line VG1 is precharged with power supply voltage VDD. Further, an address signal, not shown, is decoded, whereby the selected word line WL1 is set at "H" level and the column select signal/Y1 is set at "L" level. When the level of the word line WL1 becomes "H", the low threshold voltage transistors Q3 and Q4 are first turned on and the high threshold voltage transistors Q1 and Q2 are then turned on.

When the transistors Q3 and Q4 are turned on, the transistors Q5 and Q6 are turned on and off, respectively. Therefore, the transistors Q3 and Q5 in ON state connect the bit line BL1 to the virtual ground line VG1. However, since the voltages of both the bit lines BL1 and the virtual ground line VG1 are almost equal to the power supply voltage VDD, no current is carried between them and the voltage change of the bit line BL1 is very small.

Following this, when the transistors Q1 and Q2 are turned on, the bit lines BL1 and /BL1 are connected to the nodes N1 and N2, respectively and data on the bit line pair BL1, /BL1 is written to the flip-flop FF. At this moment, the bit line pair BL1, /BL1 have small voltage change, so that inverted data is written thereto without decreasing write operation rate.

The data write operation of the SRAM will next be described.

The data write operation for writing data when "H" level and "L" level are held in the nodes N1 and N2 of the flip-flop FF will be described herein. Since the write control signal/WE is at "H" level, the transistor $33_1$ is turned off. In addition, since the nodes N1 and N2 are at "H" level and "L" level, respectively, the transistors Q5 and Q6 are turned off and on, respectively.

Here, the level of the read control signal/RE becomes "L", the address signal, not shown, is decoded, the selected word line WL1 is set at "H" level and the column select signal/Y1 is set at "L" level. As a result, the transistor $31_1$ is turned on and the virtual ground line VG1 is connected to the ground voltage GND.

When the level of the word line WL1 becomes "H", the low threshold voltage transistors Q3 and Q4 are first turned on and the high threshold voltage transistors Q1 and Q2 are then turned on.

When the transistors Q3 and Q4 are turned on, the transistors Q5 and Q6 are turned off and on, respectively. Therefore, the transistors Q3 and Q6 in ON state connect the bit line /BL1 to the virtual ground line VG1 and "L" level is output to the bit line /BL1. As a result, not only the flip-flop FF drives the bit line but also the low threshold voltage transistors Q3 to Q6 having high current driving abilities drive the bit line, thereby accelerating the read operation.

As can be understood, the SRAM in the first embodiment includes the transistors $33_j$ for connecting the virtual ground lines VGj to the power supply voltage VDD during the data write operation, respectively. It is thereby advantageously possible to obtain an SRAM which has high read operation rate, which prevents inverted data write operation rate from being decreased, and which operates at low power supply voltage with low power consumption.

Second Embodiment

Figure 3:
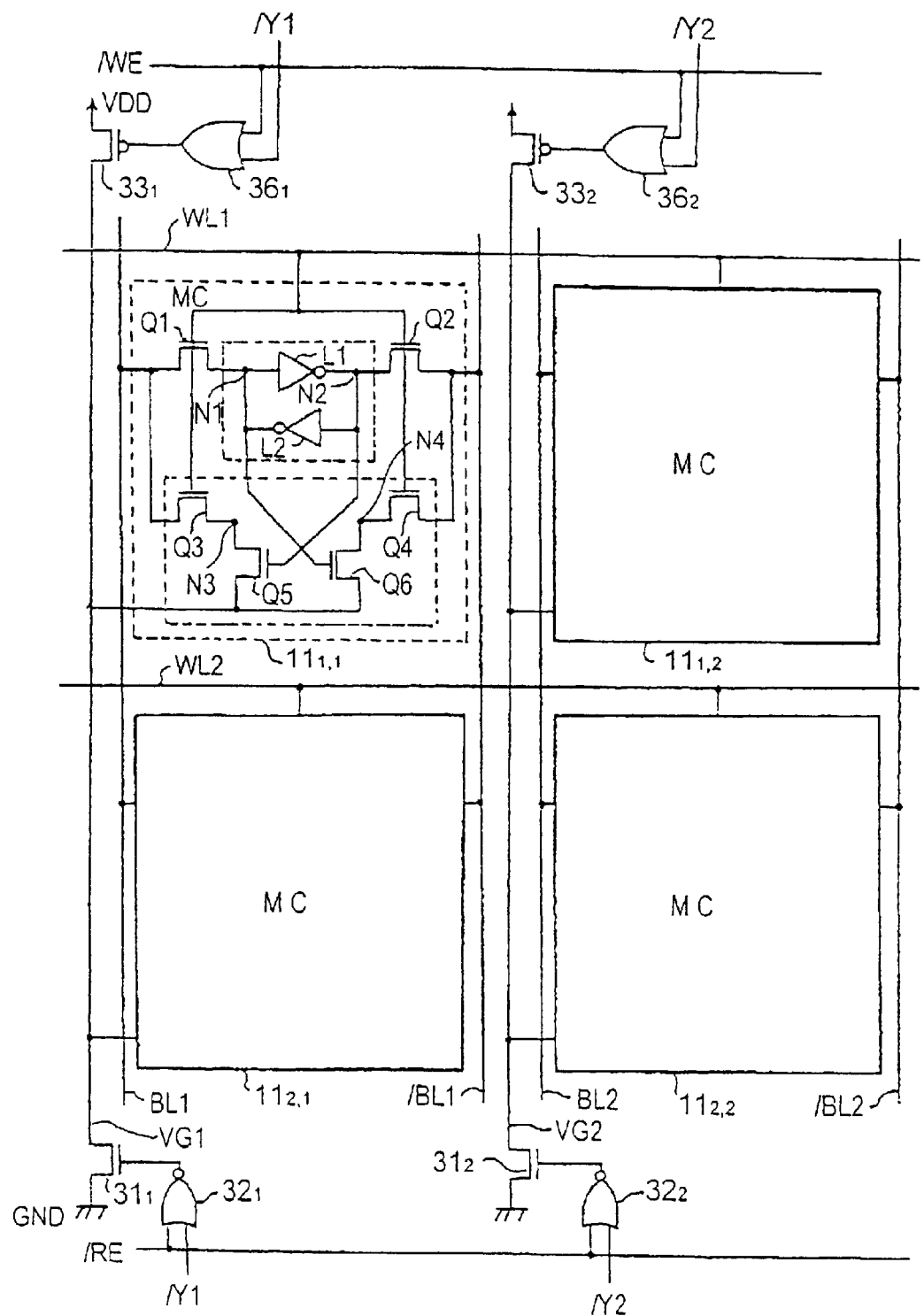
FIG. 3 is a block diagram showing the important parts of an SRAM in the second embodiment according to the present invention.

FIG. 3 is a block diagram showing the important parts of an SRAM in the second embodiment according to the present invention. The same constituent elements as those shown in FIG. 1 are denoted by the same reference symbols, respectively.

This SRAM differs from the SRAM shown in FIG. 1 in that OR circuits $36_j$ each of which ORs a write control signal/WE and a column control signal/Yj are provided in place of the inverters 34 and $35_j$ and in that transistors $33_j$ are controlled to be turned on and off by the output signals of the OR circuits $36_j$, respectively. The other constituent elements are the same as those shown in FIG. 1.

In data write operation, in this SRAM, only a virtual ground line VGj in a $j^{th}$ column selected by an address signal, not shown, is connected to the ground voltage VDD. The other operations are the same as those shown in FIG. 1. It is thereby advantageously possible not to precharge virtual ground lines which are not used for the write operation and to further decrease power consumption compared with that of the SRAM shown in FIG. 1.

Third Embodiment

Figure 4:
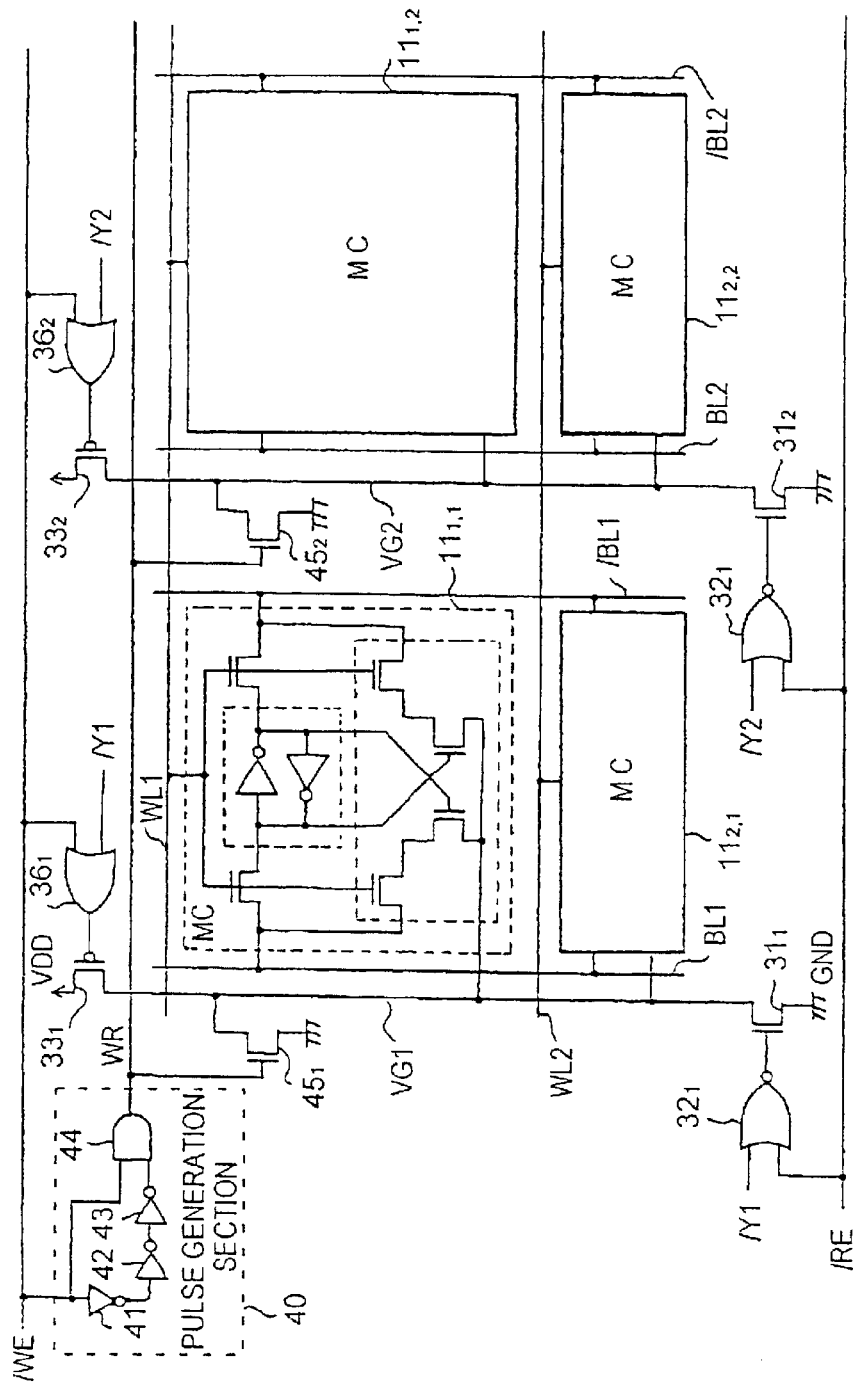
FIG. 4 is a block diagram showing the important parts of an SRAM in the third embodiment according to the present invention.

FIG. 4 is a block diagram showing the important parts of an SRAM in the third embodiment according to the present invention. The same constituent elements as those shown in FIG. 3 are denoted by the same reference symbols, respectively.

This SRAM is constituted so that a pulse generation section 40 is provided in the SRAM shown in FIG. 3 and that high threshold voltage N channel MOS transistors $45_j$ each of which controls each virtual ground line VGj and a ground voltage GND to be turned on and off, are provided according to a pulse signal WR output from the pulse generation section 40.

The pulse generation section 40 consists of inverters 41, 42 and 43 which are cascaded to thereby constitute an inversion delay circuit, and a 2-input AND (logical product) circuit 44. A write control signal/WE is applied to the inverter 41 and to the first input side of the AND circuit 44, and the output side of the inverter 43 is connected to the second input side of the AND circuit 44. The output side of the AND circuit 44 is connected to the gates of the respective transistors $45_j$ in common. By so constituting, when the level of the write control signal/WL changes from "L" level to "H" level, a pulse signal WR with a pulse width corresponding to delay time generated by the inverters 41 to 43 is output from the AND circuit 44. The other constituent elements of the SRAM are the same as those shown in FIG. 3.

Figure 5:
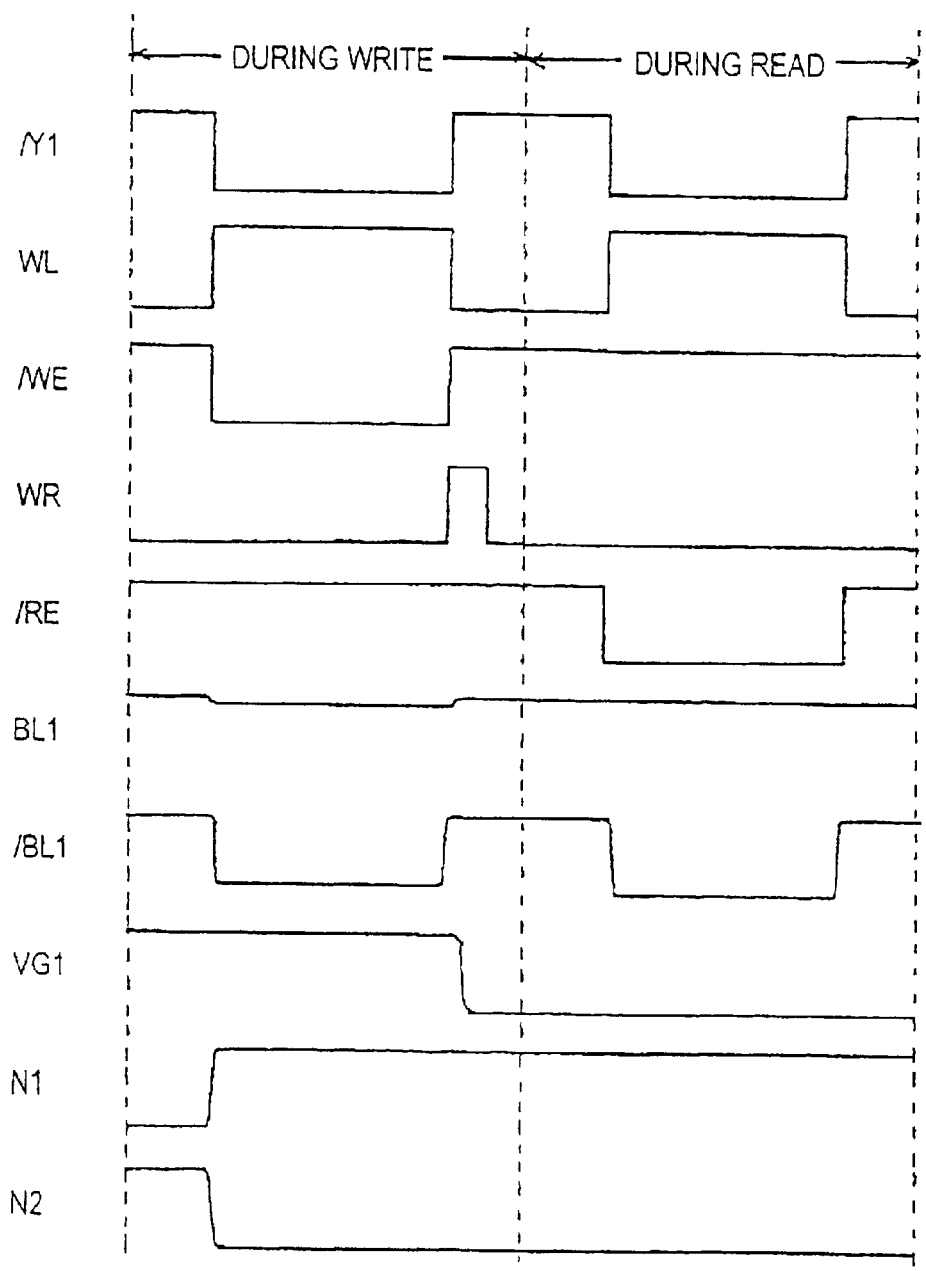
FIG. 5 is a signal waveform view showing the operation of the SRAM shown in FIG. 4.

FIG. 5 is a signal waveform view showing the operation of the SRAM shown in FIG. 4. The operation of the SRAM shown in FIG. 4 will now be described with reference to FIG. 5.

In data write operation, the level of the write control signal/WE changes from "H" level to "L" level, and write data transmitted to a bit line pair BL1, /BL1 is written to a memory cell $11_{1,1}$ selected by an address signal, not shown, as in the case of the first embodiment.

When the data write operation is finished and the level of the write control signal/WE changes from "L" level to "H" level, the pulse signal WR output from the pulse generation section 40 is set at "H" level for certain time. As a result, each transistor $45_j$ is turned on and each virtual ground line VGj is connected to a ground voltage GND. Thereafter, the level of the pulse signal WL becomes "L", each transistor $45_j$ is turned off and each virtual ground line VGj turns into a floating state. The potential of each virtual ground line VGj is kept almost equal to the ground potential GND.

Next, in data read operation, when the level of a read control signal/RE becomes "L", the word line WL1 selected by the address signal, not shown, is set at "H" level and the column select signal/Y1 is set at "L" level. As a result, the transistor $31_1$ is turned on and the virtual ground line VG1 is connected to the ground voltage GND. At this moment, the potential of the virtual ground line VG1 is set almost equal to the ground voltage GND by the pulse signal WR in advance. Therefore, the potential of the virtual ground line VG1 instantly becomes the ground potential GND. The later read operations are the same as those described in the first embodiment.

As can be understood, the SRAM in the third embodiment includes the pulse generation section 40 which temporarily connects each virtual ground line VGj to the ground voltage GND and sets the potential of the virtual ground line VGj almost equal to the ground voltage GND when the write operation is finished. The SRAM in the third embodiment exhibits an advantage in that the read operation can be accelerated besides the advantages of the second embodiment.

It is noted that the present invention is not limited to the above-stated embodiments but various changes and modifications can be made. Among these modifications, the following modifications will be described by way of example.

(a) In FIG. 1 or the like, the inverters, OR circuits or NOR circuits are employed as logical circuits for connecting the virtual ground lines VGj to the power supply voltage VDD or the ground voltage GND, respectively. Alternatively, the other logical circuits may be combined with the logical circuits.

(b) The circuit configuration of the pulse generation section 40 shown in FIG. 4 is not limited to that shown in FIG. 4. That is, it suffices that the pulse generation circuit 40 can generate the pulse signal WR for temporarily connecting each virtual ground line VGj to the ground potential GND when the data write operation is finished.

As stated so far, the SRAM according to the present invention includes the second switch circuit which temporarily connects the pseudo power supply line to the power supply potential during data write. It is thereby possible to constitute a semiconductor memory which operates at low power supply voltage with low power consumption without decreasing write operation rate.

Further, the SRAM includes the third switch circuit which connects the pseudo power supply line to the ground voltage when the data write operation is finished. It is thereby possible to accelerate data read rate.

Furthermore, the SRAM includes the second switch circuit which connects only the pseudo power supply line corresponding to a write target bit line pair to the power supply potential during data write. It is thereby possible to further decrease the power consumption.

The SRAM includes the third switch circuit which connects the pseudo power supply line to the ground voltage when the data write operation is finished. It is thereby possible to accelerate data read operation.

Further, the SRAM includes the first switch circuit which is turned on based on a control signal during data read to connect the pseudo power supply line to the ground potential, and the second switch circuit which is turned on based on the control signal during data write to connect the pseudo power supply line to the power supply potential. It is thereby possible to accelerate data read rate and data write rate.

Moreover, since the auxiliary read circuit consists of low threshold voltage transistors, it is possible to provide a semiconductor memory which operates at low power supply voltage with low power consumption.

Further, since each transistor consists of a field effect transistor, it is possible to decrease power consumption.

Additionally, since one pseudo power supply line or a bit line pair are shared between the adjacent data holding circuits, it is possible to make circuit scale small.

Furthermore, the SRAM includes the third switch circuit which connects the pseudo power supply line to the ground potential for certain time when data has been written to the data holding circuit. It is thereby possible to accelerate the next read operation.

What is claimed is:

1. A semiconductor memory comprising:
   a bit line pair consisting of a first bit line and a second bit line complementary to each other;
   a pseudo power supply line provided to correspond to said bit line pair;
   a word line arranged to cross said bit line pair;
   a data holding circuit provided at an intersection between said bit line pair and said word line, and having a first node and a second node holding data complementary to each other;
   a high threshold voltage first transistor connected between said first bit line and said first node, and driven by a potential of said word line;
   a high threshold voltage second transistor connected between said second bit line and said second node, and driven by the potential of said word line;
   a low threshold voltage third transistor connected between said first bit line and a third node, and driven by the potential of said word line;
   a low threshold voltage fourth transistor connected between said second bit line and a fourth node, and driven by the potential of said word line;
   a low threshold voltage fifth transistor connected between said third node and said pseudo power supply line, and driven by the data on said second node;
   a low threshold voltage sixth transistor connected between said fourth node and said pseudo power supply line, and driven by the data on said first node;
   a first switch circuit connected between said pseudo power supply line and a ground voltage, and turned on when the data is read from said data holding circuit and turned off otherwise; and
   a second switch circuit connected between said pseudo power supply line and a power supply voltage, and turned on when the data is written to said data holding circuit and turned off otherwise.

2. A semiconductor memory according to claim 1, wherein
   said second switch circuit is controlled to be turned on and off by an output signal of an OR circuit ORing a write control signal and a column select signal.

3. A semiconductor memory according to claim 1, comprising:
   a third switch circuit connecting said pseudo power supply line to the ground voltage for certain time when data write to said data holding circuit is finished.

4. A semiconductor memory according to claim 1, wherein
   said first to sixth transistors consists of a field effect transistor.

5. A semiconductor memory comprising:
   a plurality of bit line pairs each consisting of a first bit line and a second bit line complementary to each other;
   a plurality of pseudo power supply lines provided to correspond to said plurality of bit line pairs, respectively;
   a plurality of word lines arranged to cross said plurality of bit line pairs, respectively;
   a plurality of data holding circuits provided at intersections between said bit line pairs and said word lines, respectively, and each having a first node and a second node holding data complementary to each other;
   a plurality of first switch circuits connected between said virtual ground lines and a power supply voltage, respectively, and each turned on when the data is read from corresponding one of said data holding circuits and turned off otherwise; and
   a plurality of second switch circuits connected between said virtual ground lines and a power supply voltage, respectively, and each turned on when the data is written to corresponding one of said data holding circuits and turned off otherwise, wherein
   each of said data holding circuits comprises:
      a high threshold voltage first transistor connected between said first bit line and said first node, and driven by a potential of corresponding one of said word lines;
      a high threshold voltage second transistor connected between said second bit line and said second node, and driven by the potential of said corresponding one of said word lines;
      a low threshold voltage third transistor connected between said first bit line and a third node, and driven by the potential of said corresponding one of said word lines;
      a low threshold voltage fourth transistor connected between said second bit line and a fourth node, and driven by the potential of said corresponding one of said word lines;
      a fifth transistor connected between said third node and corresponding one of said virtual ground lines, and driven by the data on said second node; and
      a sixth transistor connected between said fourth node and the corresponding one of said pseudo power supply lines, and driven by the data on said first node.

6. A semiconductor memory according to claim 5, wherein
   each of said second switch circuit is controlled to be turned on and off by an output signal of an OR circuit ORing a write control signal and a column select signal.

7. A semiconductor memory according to claim 5, comprising:
   a plurality of third switch circuits connecting said pseudo power supply lines to the ground voltage for certain time when data write to said data holding circuits is finished, respectively.

8. A semiconductor memory according to claim 5, wherein
   said first to sixth transistors consists of a field effect transistor.

9. A semiconductor memory comprising:
   a word line;
   a bit line pair including a first bit line and a second bit line, and selected by a bit select signal;
   a pseudo power supply line provided to correspond to said bit line pair;
   a data holding circuit reading and writing data from and to a first node and a second node based on a control signal;
   a first transistor connected between said first bit line and said first node, and driven by a potential of said word line;

a second transistor connected between said second bit line and said second node, and driven by the potential of said word line;

an auxiliary read circuit connected to said pseudo power supply line, driven by a lower threshold voltage than threshold voltages of said first and second control transistors, and operating when the data is read from said data holding circuit;

a first switch circuit connected between said pseudo power supply line and a ground potential, and turned on when the data is read from said data holding circuit to connect said pseudo power supply line to said ground potential based on said control signal; and a second switch circuit connected between said pseudo power supply line and a power supply potential, and turned on when the data is written to said data holding circuit to connect said pseudo power supply line to the power supply potential based on said control signal.

10. A semiconductor memory according to claim 9, wherein said auxiliary read circuit comprises:

a low threshold voltage third transistor connected between said first bit line and a third node, and driven by the potential of said word line;

a low threshold voltage fourth transistor connected between said second bit line and a fourth node, and driven by the potential of said word line;

a low threshold voltage fifth transistor connected between said third node and said pseudo power supply line, and driven by the data on said second node; and a low threshold voltage sixth transistor connected between said fourth node and said pseudo power supply line, and driven by the data on said first node.

11. A semiconductor memory according to claim 10, wherein said first to sixth transistors consists of a field effect transistor.

12. A semiconductor memory according to claim 9, wherein said data holding circuits adjacent each other share one of said virtual ground lines.

13. A semiconductor memory according to claim 9, wherein said data holding circuits adjacent each other further share one of said bit line pairs.

14. A semiconductor memory according to claim 9, wherein said second switch circuit is controlled to be turned on and off by an output signal of an OR circuit ORing a write control signal and a column select signal.

15. A semiconductor memory according to claim 9, wherein a third switch circuit connecting said pseudo power supply line to the ground voltage for certain time when data write to said data holding circuit is finished.

* * * * *